(12) United States Patent
Li

(10) Patent No.: US 7,418,649 B2
(45) Date of Patent: Aug. 26, 2008

(54) EFFICIENT IMPLEMENTATION OF REED-SOLOMON ERASURE RESILIENT CODES IN HIGH-RATE APPLICATIONS

(75) Inventor: Jin Li, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 565 days.

(21) Appl. No.: 11/082,037

(22) Filed: Mar. 15, 2005

(65) Prior Publication Data

US 2006/0212782 A1 Sep. 21, 2006

(51) Int. Cl.
H03M 13/00 (2006.01)
(52) U.S. Cl. .................... 714/784; 714/756; 375/260; 375/261
(58) Field of Classification Search ............. 714/784, 714/756; 375/260–261
See application file for complete search history.

(56) References Cited

U.S. PATENT DOCUMENTS

| 6,393,065 B1 * | 5/2002 | Piret et al. ............... 375/261 |
| 2007/0253496 A1 * | 11/2007 | Giannakis et al. .......... 375/260 |

OTHER PUBLICATIONS

Byers, J., Luby, M., Mitzenmacher, M. and Rege, A., "A digital fountain approach to reliable distribution of bulk data", in *Proceedings of ACM SIGCOMM '98*, Vancouver, Canada, Sep. 1998.

Barg, A., and Forney, G. D., "Random codes: minimum distances and error exponents", in *IEEE Trans. on Inform Theory*, vol. 48, No. 9, Sep. 2002, pp. 2568-2573.

Bloemer, J., Kalfane, M., Karpinski, M., Karp, R., Luby M., and Zuckerman, D., "An xor-based erasure-resilient coding scheme", *ICSI TR-95-048*, Aug. 1995, Berkeley, CA.

Gao, S., "A new algorithm for decoding Reed-Solomon codes", in *Communications, Information and Network Security* (V. Bhargava, H. V. Poor, V. Tarokh and S. Yoon, Eds.), Kluwer Academic Publishers, 2003, pp. 55-68.

Grigoriev, D., Karpinski, M., and Singer, M., "Fast parallel alogrithms for sparse multivariate polynomial over finite fields", in *SIAM Journal on Computing*, vol. 19, 1990, pp. 1059-1063.

Kaufman, I., "The inversion of the Vandermonde matrix and transformation to the Jordan canonical form", *IEEE Trans. On Automatic Control*, vol. 14, No. 6, Dec. 1969, pp. 774-777.

(Continued)

*Primary Examiner*—Guy J Lamarre
(74) *Attorney, Agent, or Firm*—Lyon & Harr, L.L.P.; Craig S. Fischer

(57) ABSTRACT

A high-rate Reed-Solomon erasure resilient codes (ERC) system and method for generating and implementing Reed-Solomon erasure-resilient codes for use in high-rate applications. High-rate applications are applications where the number of coded messages is significantly higher (such as an order of magnitude) than the number of original messages. The Reed-Solomon ERC system uses a scalar vector multiplication and addition technique and a direct inversion technique. The direct inversion technique uses specific generator matrices, including a modified Vandermonde Matrix and a Cauchy Matrix, to directly calculate an inverse of the sub-generator matrix of receiving ERC-coded messages. The scalar vector multiplication and addition technique generates high-rate Reed-Solomon codes and performs scalar vector multiplication and addition on the Galois Field for the Reed-Solomon erasure encoding/decoding operations. In effect, the Reed-Solomon codes are "tuned" for use in the high-rate environment.

15 Claims, 5 Drawing Sheets

OTHER PUBLICATIONS

Luby, M., Mitzenmacher, M., Shokrollahi, A., Spielman, D., "Efficient Erasure Correcting Codes", in *IEEE Trans. on Information Theory*, vol. 47, No. 2, pp. 569-584, Feb. 2001.

Luby, M., "LT Codes", in *43rd Annual IEEE Symposium on Foundations of Computer Science*, 2002.

Rabin, M. O., "Efficient dispersal of information for security, load balancing, and fault tolerance", in *J. ACM*, vol. 36, No. 2, Apr. 1989, pp. 335-348.

Tan, W., and Cruz., J. R., "Analyzing low-density parity-check codes on partial response channels with erasures using density evolution", in *IEEE Trans. on Magnetics*, vol. 40, No. 5, Sep. 2004, pp. 3411-3418.

Zhang, C., and Li, J., "Distributed hosting of web content with erasure coding and unequal weight assignment", in *Proc. IEEE International Conf. on Multimedia Expo'* 2004, Taipei, Taiwan, Jun. 2004.

* cited by examiner

EFFICIENT IMPLEMENTATION OF REED-SOLOMON ERASURE RESILIENT CODES IN HIGH-RATE APPLICATIONS

TECHNICAL FIELD

The present invention relates in general to signal processing and more particularly to a system and method for generating and efficiently implementing novel Reed-Solomon erasure-resilient codes for use in high-rate applications.

BACKGROUND OF THE INVENTION

Erasure-resilient codes enable lossless data recovery notwithstanding loss of information during storage or transmission. Erasure-resilient codes, which are derived from error correction codes, are designed to be tolerant of data loss. Erasure-resilient codes add redundant information to the stored or transmitted data. Thus, erasure-resilient codes take an original message and generate redundant data (or coded messages) from the original message. These coded messages are a mathematical combination of the original message. The original message is encoded into a plurality of encoded messages. If one or more of the encoded messages is lost, it is possible to recover the original message in a lossless manner. In general, adding more coded messages allows lossless recovery of the original message at higher error or data loss rates. However, this also reduces the transmission or storage efficiency of the associated system.

High-rate erasure-resilient codes are block error correction codes with a large coded message space. In other words, high rate means that the number of coded messages is much larger than the number original messages. This allows the high-rate erasure-resilient codes to be used for high error or data loss applications, especially content distribution and backup applications. By way of example, one application is the digital fountain paradigm, where a server multicasts or broadcasts erasure coded messages non-stop to a plurality of clients. Each client may tune in from time to time to receive the coded messages that are being sent at that moment. Another application is the distributed backup, where a file is erasure encoded and stored in a large number of storage units, either locally or in a distributed fashion. During the recovery process, the client attempts to restore the file from the accessible storage units. Yet another application is the distributed content hosting, streaming, or both. In this application, a file or media is distributed to a number of hosting servers, each of which may elect to host a portion of the file or media in the erasure coded form. During the retrieval process, the client locates the hosting servers that are willing to serve and retrieves the erasure coded file or media simultaneously from those servers. In each of the above applications, a file, media, or both are encoded into a large number of distinctive coded messages. During retrieval, the client attempts to use a minimum number of the coded messages that are equal to or slightly larger than the original messages to recover the file or media. The client usually does not have control over what coded messages are available. As a result, the process of distributed content broadcast, backup, hosting, or streaming can be considered as passing the coded messages through an erasure channel with heavy loss, and recovering the messages afterwards.

A number of error correction codes can serve as high-rate error-resilient codes. These codes include the random generation of linear codes (RLC), the low-density parity check (LDPC) codes, turbo codes, LT codes, and Reed-Solomon codes. Among the error correction codes, the Reed-Solomon codes stand out with a number of unique properties. For instance, Reed-Solomon codes are maximum distance separable (MDS) codes. They achieve the maximum channel coding efficiency, and are able to decode the original messages with the exact number of received coded messages. Because the generator matrix of the Reed-Solomon codes are structured, the Reed-Solomon coded message can be identified by the row index, which reduces the overhead needed to identify the coded message. Reed-Solomon codes can be applied to messages with small access granularity (short message and small number of original messages), and are suitable for on demand distributed content hosting/streaming applications.

Reed-Solomon erasure resilient codes are typically used in low-rate applications (such as satellite communications). These codes are not designed to operate in high-rate environments. Although the implementation of the Reed-Solomon error correction codes has been extensively investigated, there are relatively few works on the efficient implementation of the Reed-Solomon codes for high rate error resilient coding application, which bears unique characteristics. For example, in a high-rate erasure resilient coding scenario, the coded messages are generated on demand, just prior to message distribution. This is different from the error correction coding application, where all coded messages are generated at the same time. Another difference is that much more parity messages are generated and received in high-rate erasure resilient coding. Another difference is that low-rate applications have a much larger k number of original messages than the number of encoded messages (n–k). Also, low-rate applications typically do not have a long string of symbols/vectors per original/coded messages. In contrast, in high-rate applications described above, each original/coded message is usually consisted of a long string of symbols that is approximately an order of magnitude larger than k. Thus, existing implementations of Reed-Solomon error correction codes may not work efficiently and quickly in high-rate erasure resilient encoding/decoding operations.

Both the low-rate and high-rate Reed-Solomon codes include a generator matrix that uses the Galois field. However, the low-rate generator matrix has a much different composition than in the high-rate case. For example, when used in a low-rate application (such as in satellite communications), the generator matrix has a large identity matrix on the top part of the matrix. So the generator matrix for low-rate applications is not nearly as full as the generator matrix for high-rate applications. Many technologies used in low-rate applications for fast Reed-Solomon encoding/decoding (such as Fourier transform) do not apply and cannot be used in the high-rate applications.

Therefore, what is needed is system and method that generates and implements Reed-Solomon erasure-resilient codes in high-rate applications in an efficient manner. What is also needed is a system and method that provides tuning of high-rate Reed-Solomon erasure-resilient codes such that they are designed to operate and be used in high-rate applications.

SUMMARY OF THE INVENTION

The invention disclosed herein includes a Reed-Solomon erasure resilient codes (ERC) system and method that uses a novel Reed-Solomon ERC technique that is "tuned" for use in high-rate applications. A high-rate application is one where the number of coded messages is much larger (such as an order of magnitude larger) than the number of original messages. The novel Reed-Solomon ERC includes a scalar vector multiplication and addition technique, for scalar and vector multiplication in a Galois field, and a direct inversion technique, for providing a direct means of generating an inverse sub-generator matrix for the novel Reed-Solomon ERC. The sub-generator matrix is generated from a generator matrix that may be a Cauchy matrix or a Vandermonde matrix. By using specific generator matrices, including a modified Vandermonde Matrix and a Cauchy Matrix, the direct inversion technique directly calculates the inverse of the sub-generator matrix of the receiving ERC coded messages, thereby reducing the computation used in the decoding.

The new Reed-Solomon ERC system and method is designed to operate in a peer-to-peer (P2P) networking environment. The new Reed-Solomon ERC system is disposed on each peer node in the P2P network. The new Reed-Solomon ERC system includes a new high-rate Reed-Solomon ERC encoder and a new high-rate Reed-Solomon ERC decoder that use the above-mentioned techniques.

The new high-rate Reed-Solomon ERC uses special generator matrices so that the sub-generator matrices formed by the coded messages may be directly inversed. Moreover, the new high-rate Reed-Solomon ERC uses the scalar vector multiplication and addition technique to efficiently perform Reed-Solomon ERC encoding/decoding operations in high-rate applications. In general, the technique produces an updated element of an updated vector y using the current element. The technique begins by establishing logarithm and exponential lookup tables. Next, an optional step tests a scalar number (alpha or $\alpha$) to see whether it is non-zero. If so, then an updated element of the update vector is equal to the current element.

If alpha ($\alpha$) is non-zero, then the logarithm of alpha is calculated using the logarithmic lookup table. Next, each element of a content vector x then is tested to determine whether it is non-zero. If the element is non-zero, then the logarithm of the element is calculated using the logarithm lookup table. The exponential of the sum of the logarithm of alpha ($\alpha$) and the logarithm of the element is determined, using the exponential lookup. This generates an intermediate result. An updated element of the update vector is generated by xoring the intermediate result to the current element. This is repeated until the elements of the update vector have been processed.

BRIEF DESCRIPTION OF THE DRAWINGS

The present invention can be further understood by reference to the following description and attached drawings that illustrate aspects of the invention. Other features and advantages will be apparent from the following detailed description of the invention, taken in conjunction with the accompanying drawings, which illustrate, by way of example, the principles of the present invention.

Referring now to the drawings in which like reference numbers represent corresponding parts throughout.

DETAILED DESCRIPTION OF THE INVENTION

In the following description of the invention, reference is made to the accompanying drawings, which form a part thereof, and in which is shown by way of illustration a specific example whereby the invention may be practiced. It is to be understood that other embodiments may be utilized and structural changes may be made without departing from the scope of the present invention.

I. Introduction

Current Reed-Solomon erasure resilient codes are geared towards low-rate applications where finding errors quickly is the main goal. These low-rate Reed-Solomon codes are designed for use in a low-rate environment. However, they perform poorly and are inefficient when used in high-rate environments, such as digital fountain applications and distributed backup applications. High-rate applications are applications where the coded message space is at least an order of magnitude greater than the number of original messages. Although the implementation of Reed-Solomon codes for error correction coding has been extensively investigated in the past, there is little work on the efficient implementation of Reed-Solomon codes for high-rate erasure resilient coding applications.

The new high-rate Reed-Solomon erasure resilient codes (ERC) system and method described herein is a novel solution the efficient implementation of Reed-Solomon erasure resilient codes in high-rate applications. A number of techniques are used to achieve an efficient and fast implementation of the Reed-Solomon erasure resilient code for high-rate application use. In particular, a direct inversion technique is used to calculate the direct inverse of the Reed-Solomon sub-generator matrix. This process is geared toward the quick inversion of the sub-generator matrix, and not toward quickly finding errors, as in existing techniques. Moreover, a scalar vector multiplication and addition technique is used to perform scalar vector multiplication and addition on the Galois Field in order to speed up the Reed-Solomon erasure encoding/decoding operations. Using these novel techniques, the new high-rate Reed-Solomon ERC system and method is "tuned" for maximum performance in the high-rate environment and achieve a marked improvement over existing techniques.

II. General Overview

Figure 1:
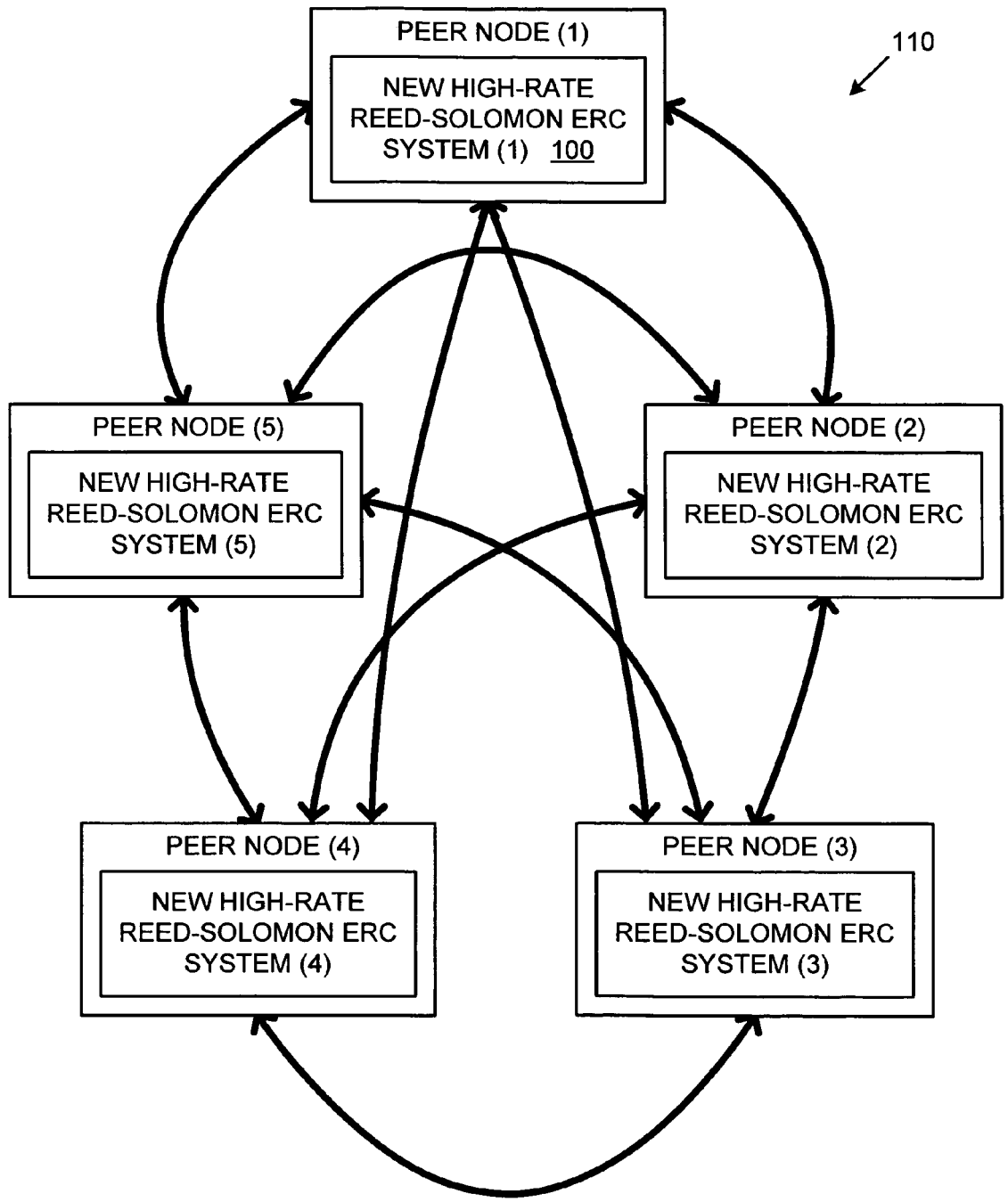
FIG. 1 is a block diagram illustrating the new high-rate Reed-Solomon ERC system and method disclosed herein implemented in a peer-to-peer (P2P) network.

FIG. 1 is a block diagram illustrating the new high-rate Reed-Solomon ERC system and method disclosed herein implemented in a peer-to-peer (P2P) network. It should be noted that FIG. 1 illustrates only one of several way in which the new high-rate Reed-Solomon ERC system and method may implemented and used.

Referring to FIG. 1, in this exemplary implementation, the new high-rate Reed-Solomon ERC system 100 is shown implemented in a fully-connected peer-to-peer (P2P) network 110. In the exemplary implementation shown in FIG. 1, the P2P network 110 includes five peer nodes, namely peer node (1), peer node (2), peer node (3), peer node (4), and peer node (5). The peer nodes (1), (2), (3), (4), (5) are fully connected, as shown by the arrows. Each of the peer nodes (1), (2), (3), (4), (5) contains the new high-rate Reed-Solomon ERC system and method the P2P audio communication system 100. The new high-rate Reed-Solomon ERC system 100 are given different numbers when they reside on different peer nodes to illustrate that, at a minimum, they are different copies of the new high-rate Reed-Solomon ERC system 100.

Figure 2:
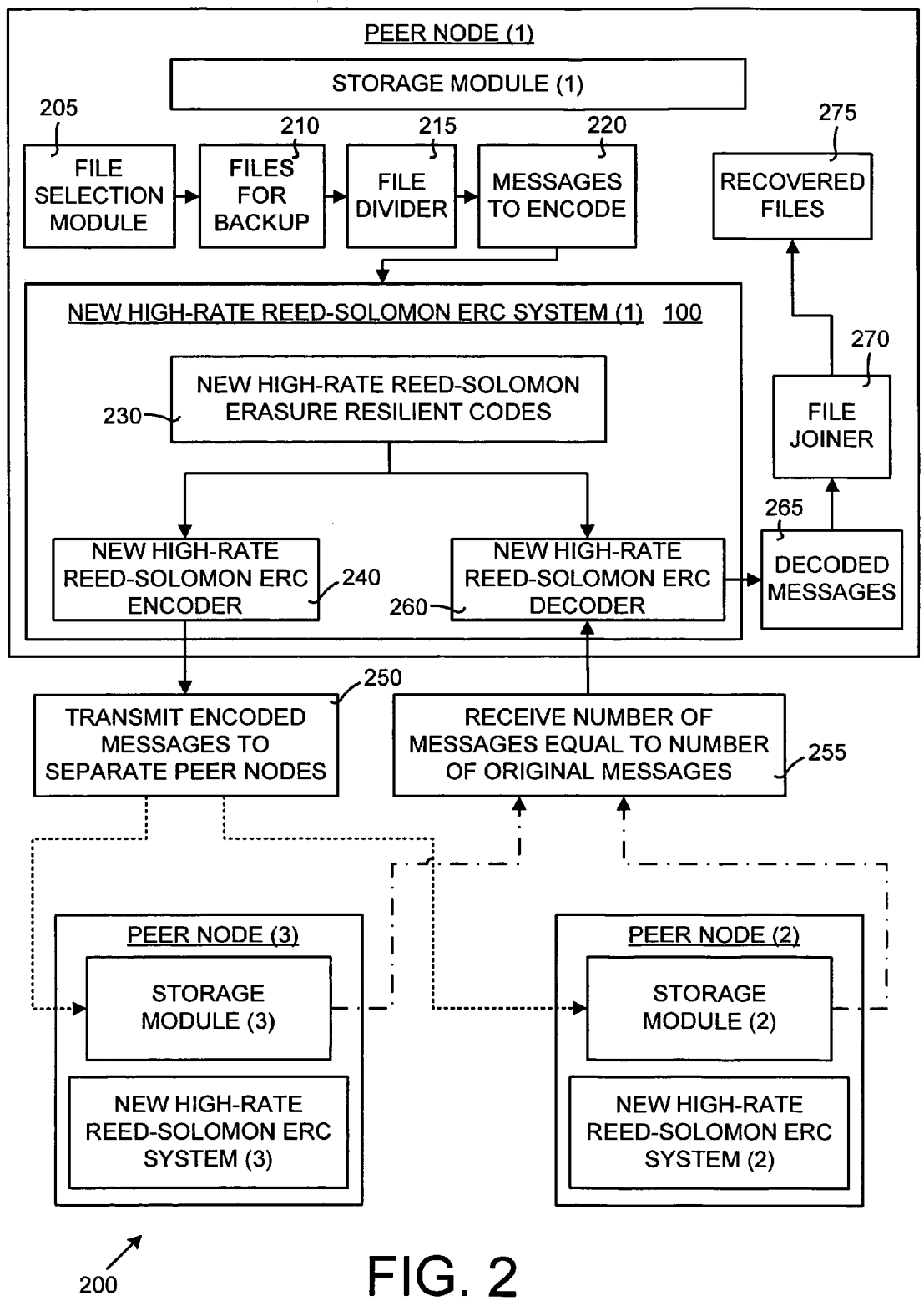
FIG. 2 is a block diagram illustrating an exemplary implementation of the new high-rate Reed-Solomon ERC system and method in a distributed backup application.

In order to provide an overview of the new high-rate Reed-Solomon ERC system 100 shown in FIG. 1, an exemplary application is offered. Specifically, FIG. 2 is a block diagram illustrating an exemplary implementation of the new high-rate Reed-Solomon ERC system and method in a distributed backup application. It should be noted that the new high-rate Reed-Solomon ERC system 100 can be used in a variety of other high-rate applications other than the one shown in FIG. 2.

The distributed backup application is a high-rate application whereby a file is erasure encoded and stored in a large number of storage units. During recovery, the client attempts to restore the file from the accessible storage units. Referring to FIG. 2, the distributed backup environment 200 includes the new high-rate Reed-Solomon ERC system 100 shown in FIG. 1. For convenience, only peer nodes (1), (2) and (3) are illustrated for P2P network in FIG. 2. It should be understood, however, that typically many more peer nodes will be present on the P2P network.

In the P2P network, each peer node can act as a client (receiving data from other peer nodes) and as a server (providing information to other peer nodes). As shown in FIG. 2, peer node (1) is acting as the client in this exemplary implementation. In the client mode, peer node (1) is using the new high-rate Reed-Solomon ERC system 100 to backup a user's data. The distributed backup of a client involves at least two processes: (1) storage of the files to be backed up; and (2) recovery of the stored files.

The storage of the data to be backed up begins with a file selection module 205 selecting files for backup 210. The file then is divided by a file divider 215 to generate k messages (called original messages) to encode 220. The original messages are input to the new high-rate Reed-Solomon ERC encoding system 100. The new high-rate Reed-Solomon ERC encoding system 100 uses new high-rate Reed-Solomon erasure resilient codes 230 for encoding and decoding operations. Using a new high-rate Reed-Solomon ERC encoder 240, the client generates $k_1$ coded messages to be stored in a certain peer node (in this case, the peer node (3) and the peer node (2)). Each coded message is identified by a key, which in the case of Reed-Solomon ERC, can simply be the row index of the generator matrix. Note that for backup applications, $k_1$ is always smaller than or equal to k, and is usually much smaller than k. For example, $k_1$ can simply be 1. Nevertheless, the $k_1$ coded messages are drawn from a very large coded message space n, where n is much larger than k. The large coded message space n allows distinct coded messages to be distributed to different peers. The coded messages then are transmitted to separate peer nodes 250. As shown by the dotted lines in FIG. 2, the coded messages from peer node (1) are sent to a storage module (2) of peer node (2) and a storage module (3) of peer node (3). Peer node (1) also contains a storage module (1) for storing coded messages from other peers.

If the storage module of the certain peer node in the P2P network goes down, then a recovery of the stored files occurs. As shown in FIG. 2, the recovery process for peer node (1) involves receiving a number of distinctive coded messages from the other peer nodes equal to the number of original messages 255. Assuming each peer node holds $k_1$ coded messages, a total of $k/k_1$ peers need to be contacted. The new high-rate Reed-Solomon ERC system 100 facilitates only needing a number of coded messages that is exactly equal to the number of the original messages. This is due to the fact that in the new high-rate Reed-Solomon ERC system 100 any sub-generator matrix of the Reed-Solomon ERC is full rank and invertible. This special property is discussed below. These selectively-retrieved coded messages are decoded by a new high-rate Reed-Solomon ERC system decoder 245. The decoded messages 265 then are put back together by a file joiner 270 to obtain recovered files 275

For the first $n/k_1$ peers, the client can guarantee in assigning different coded messages to different peers, thus ensuring that no peers have the same coded message. For more peers, the client may randomly assign new peers with coded messages. In such a case, certain peer nodes may hold the same coded messages. Nevertheless, in the recovery stage, when the clients retrieves k encoded messages from $k/k_1$ peers, the probability of conflict is low, as the coded message space n is much larger than k.

III. Operational Overview

Figure 3:
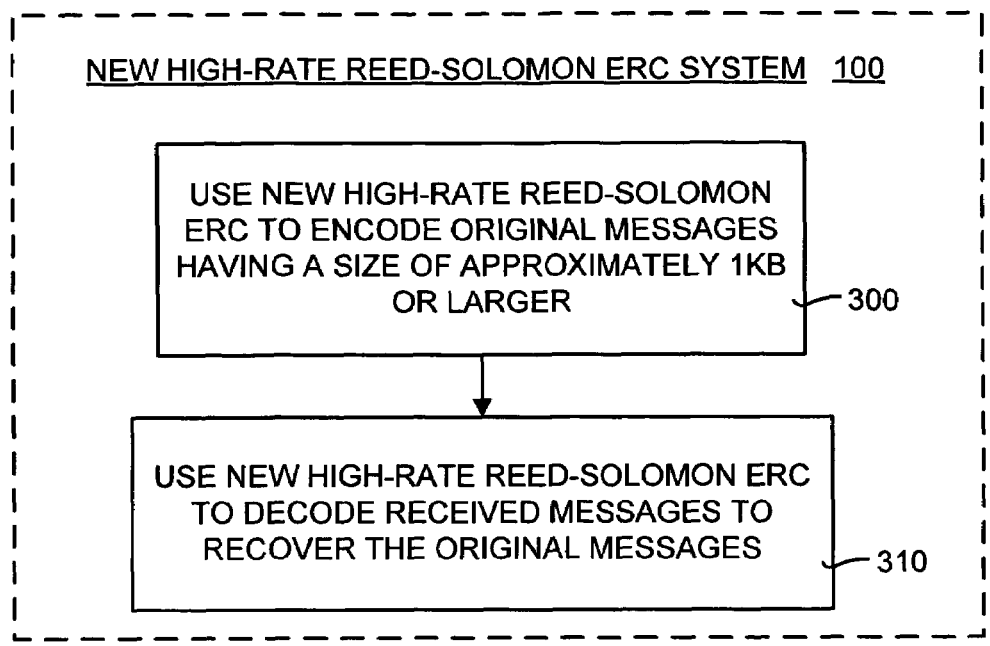
FIG. 3 is a general flow diagram illustrating the general operation of the new high-rate Reed-Solomon ERC system and method shown in FIGS. 1 and 2.

The operation of the new high-rate Reed-Solomon ERC system 100 shown in FIGS. 1 and 2 now will be discussed. FIG. 3 is a general flow diagram illustrating the general operation of the new high-rate Reed-Solomon ERC system 100. In general, the new high-rate Reed-Solomon ERC method uses new high-rate Reed-Solomon erasure resilient codes and techniques for more efficient and quicker use in high-rate applications. The high-rate Reed-Solomon erasure resilient codes are in effect "tuned" for use in high-rate applications. The novel techniques of the new high-rate Reed-Solomon ERC method include calculating the direct inverse of the Reed-Solomon sub-generator matrix, and using a scalar vector multiplication and addition technique on the Galois field to speed up the Reed-Solomon erasure encoding and decoding operations.

Referring to FIG. 3, the new high-rate Reed-Solomon ERC codes are used to encode original messages having a size of approximately 1 Kb or larger (box 300). Typically, these original messages consist of multiple symbols. The new high-rate Reed-Solomon ERC codes also are used to decode received messages such that the original messages are recovered (box 310).

IV. Operational Details

The details of the operation of the new high-rate Reed-Solomon ERC method shown in FIG. 3 now will be discussed.

Scalar Vector Multiplication and Addition Technique

Figure 4:
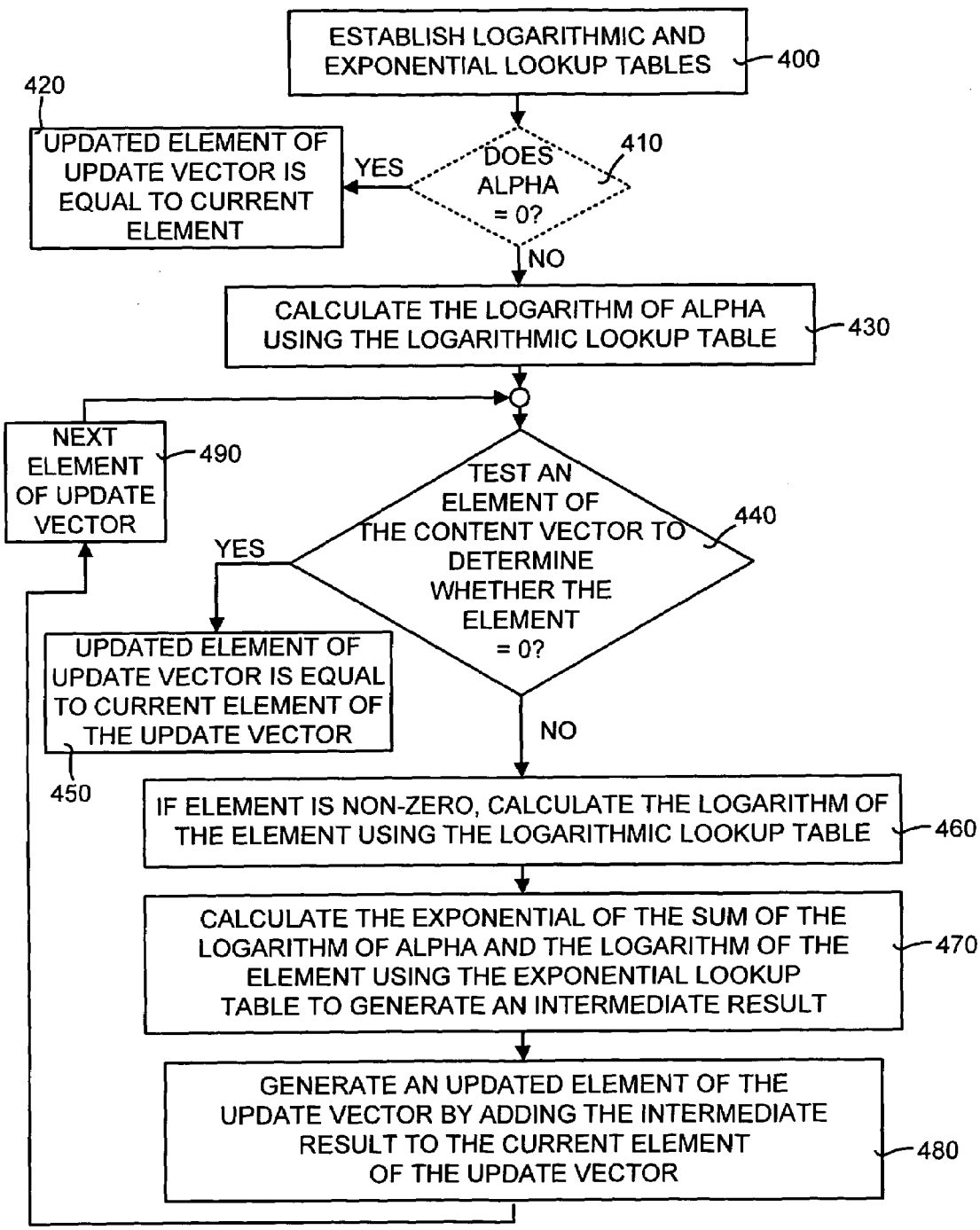
FIG. 4 is a detailed flow diagram of the operation of the scalar-vector multiplication and addition technique.

The new high-rate Reed-Solomon erasure resilient codes use a scalar vector multiplication and addition technique on a Galois field that speeds up the Reed-Solomon ERC encoding and decoding operations. FIG. 4 is a detailed flow diagram of the operation of this scalar vector multiplication and addition technique. The technique begins by establishing logarithmic and exponential lookup tables (box 400). Next, a determination is made as to whether the alpha ($\alpha$) equals zero (box 410). Alpha ($\alpha$) is a scalar number that is used below in equation (27). It should be noted that this step is optional (as denoted by the dotted line). If it is known that alpha ($\alpha$) is non-zero, then this step does not need to be performed. If alpha ($\alpha$) equals zero, then the updated element of an update vector y is equal to the current element (box 420). This is the equivalent of doing nothing, or performing no further operations on the current element.

If alpha ($\alpha$) is non-zero, then the logarithm of alpha is calculated using the logarithmic lookup table (box 430). Next, each element of a content vector x is tested to determine whether the element is equal to zero (box 440). If the element is equal to zero, then an updated element of the update vector is equal to the current element (box 450). This is also the equivalent of doing nothing, or performing no further operations on the current element. Otherwise, for each element that is non-zero, the logarithm of the element is calculated using the logarithmic lookup table (box 460). The exponential of the sum of the logarithm of alpha ($\alpha$) and the logarithm of the element is determined, using the exponential lookup (box 470). This generates an intermediate result. An updated element of the update vector y is generated by adding on the Galois Field (xoring) the intermediate result to the current element (box 480). The next element of the update vector then is tested, until all the elements have been processed (box 490).

Direct Inversion Technique

The new high-rate Reed-Solomon erasure resilient codes use a direct inversion technique that calculates a direct inverse of a Reed-Solomon sub-generator matrix to speed up the Reed-Solomon ERC encoding and decoding operations. The direct inversion technique uses specific generator matrices to directly calculate an inverse of the sub-generator matrix of the receiving ERC coded messages. This direct inversion reduces the computation used in the decoding. The specific generator matrices include at least one of a novel modified Vandermonde Matrix and a Cauchy Matrix.

Figure 5:
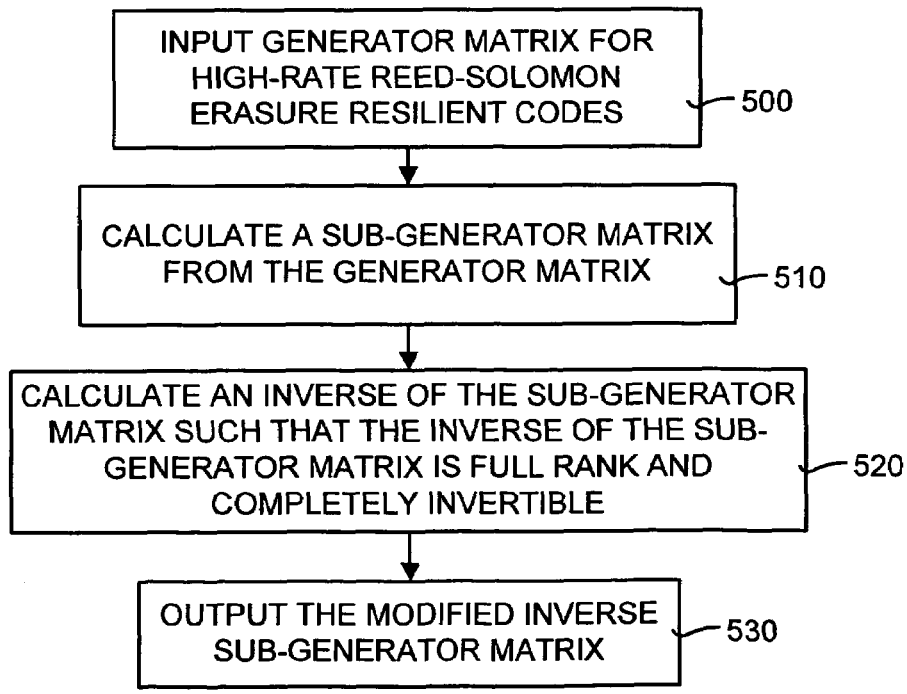
FIG. 5 is a detailed flow diagram of the operation of the direct inversion technique.

FIG. 5 is a detailed flow diagram of the operation of the direct inversion technique. The technique begins by inputting a generator matrix for high-rate Reed-Solomon erasure resilient codes (box 500). The generator matrix can be a Vandermonde matrix or a Cauchy matrix. In a preferred embodiment, the Cauchy matrix is slightly preferred.

Next, the direct inversion technique calculates a sub-generator matrix from the generator matrix (box 510). An inverse of the sub-generator matrix then is calculated such that the resulting inverse sub-generator matrix is full rank and completely invertible (box 520). This is an important property because there is only the need to receive k messages in order to completely recover the original k messages. The modified inverse sub-generator matrix then is output (box 530).

High-Rate Reed-Solomon Erasure Resilient Codes

High-rate erasure resilient codes are block error correction codes. The codes may described with parameter (n, k), where k is the number of the original messages, and n is the number of the coded messages. The high-rate erasure resilient codes satisfy the property that n is much larger than k, thus the k original messages can be expanded into a much larger space of n coded messages. The maximum expansion ratio r of the high-rate erasure resilient codes is defined as:

$$r = n/k. \quad (1)$$

At the time of decoding, the client receives m messages, where m is a number equal to or slightly larger than k, and attempts to decode the k original messages from the m received coded messages. The operation of the high-rate erasure resilient codes can be described via matrix multiplication over the Galois Field, GF(p):

$$\begin{bmatrix} c_0 \\ c_1 \\ \vdots \\ c_{n-1} \end{bmatrix} = G \begin{bmatrix} x_0 \\ x_1 \\ \vdots \\ x_{k-1} \end{bmatrix}, \quad (2)$$

where p is the order of the Galois Field, $\{x_0, x_1, \ldots, x_{k-1}\}$ are the original messages, $\{c_0, c_1, \ldots, c_{n-1}\}$ are the coded messages, and G is the generator matrix. Each original/coded messages $x_i/c_i$ is usually a long vector, consists of /GF(p) elements. When the client decodes from the m received coded messages, the decoding operation becomes solving:

$$\begin{bmatrix} c'_0 \\ c'_1 \\ \vdots \\ c'_{m-1} \end{bmatrix} = G_m \begin{bmatrix} x_0 \\ x_1 \\ \vdots \\ x_{k-1} \end{bmatrix}, \quad (3)$$

where $\{c'_0, c'_1, \ldots, c'_{m-1}\}$ are the received messages, $G_m$ is a sub-generator matrix formed by the m rows of the generator matrix G that correspond to the coded messages. If the sub-generator matrix Gm has a full rank k, the original messages can be recovered.

Reed-Solomon codes use a structured generator matrix G on GF(p) that has the property that any k rows of the generator matrix G forms a k×k matrix of full rank. As a result, Reed-Solomon codes are maximum distance separable (MDS) codes with the best error-correction/erasure error resilience property. Many existing Reed-Solomon codes use a generator matrix G where the matrix is an identity matrix plus a Vandermonde matrix. This is geared toward quickly finding errors. This type of Vandermonde matrix has an identity matrix on the top part of the Vandermonde matrix. The new high-rate Reed-Solomon ERC method uses a modified Vandermonde matrix that is geared toward achieving a faster inverse. The modified Vandermonde matrix is given by:

$$G = \begin{bmatrix} 0^0 & 0^1 & \cdots & 0^k \\ 1^0 & 1^1 & \cdots & 1^k \\ \vdots & \vdots & \ddots & \vdots \\ (n-1)^0 & (n-1)^1 & \cdots & (n-1)^k \end{bmatrix}. \quad (4)$$

More specifically, a coded message with key i can be generated by:

$$c_i = [i^0 \ i^1 \ \cdots \ i^{k-1}] \begin{bmatrix} x_0 \\ x_1 \\ \vdots \\ x_{k-1} \end{bmatrix},$$

In Reed-Solomon error correction coding, it is customary to form a message polynomial of:

$$f(y) = x_0 + x_1 y^1 + x_2 y^2 + \ldots + x_{k-1} y^{k-1}, \quad (5)$$

and represent the parity messages as:

$$c_i = f(i), i = 1, 2, \ldots, n. \quad (6)$$

Most Reed-Solomon error correction coding operations favor the polynomial representation form of equations (5) and (6). However, in high-rate erasure resilient coding, the matrix representation form of equations (2)-(4) is favored.

An alternative form of Reed-Solomon codes uses the Cauchy matrix as the generator matrix:

$$G = \begin{bmatrix} I_k & & & \\ \frac{1}{k+0} & \frac{1}{k+1} & \cdots & \frac{1}{k+(k-1)} \\ \frac{1}{(k+1)+0} & \frac{1}{(k+1)+1} & \cdots & \frac{1}{(k+1)+(k-1)} \\ \vdots & \vdots & \ddots & \vdots \\ \frac{1}{(n-1)+0} & \frac{1}{(n-1)+1} & \cdots & \frac{1}{(n-1)+(k-1)} \end{bmatrix}. \quad (7)$$

With such a Reed-Solomon code, the first k messages are original (systematic) messages (marked by the identity matrix $I_k$), and the rest n−k messages are parity (coded) messages. In the invention disclosed herein, both the Vandermonde matrix and the Cauchy matrix based Reed-Solomon erasure encoding/decoding operation is made quicker and more efficient by using a scalar vector multiplication and addition operation described below.

It can be shown that for both Vandermonde and Cauchy based Reed-Solomon codes, the maximum expansion ratio r achievable is p/k. Thus, on GF(p), a (p,k) Reed-Solomon code can be constructed that generates at most p coded messages, regardless of the number of original messages k. In most high-rate erasure resilient coding applications, equation (2) is usually not used to generate all the coded messages. Instead, equation (2) it defines a coded message space. The encoded messages are generated on-demand and one-by-one, for each multicast/broadcast message, each backup storage unit, or each hosting server, depending on the high-rate application. In the high-rate erasure resilient decoding, k coded messages are collected, with each coded message identifiable through the row index of the generator matrix. The erasure resilient decoding operation then consists of the inversion of the sub-generator matrix Gk, and the multiplication of the inverse with that of the coded messages:

$$\begin{bmatrix} x_0 \\ x_1 \\ \vdots \\ x_{k-1} \end{bmatrix} = G_k^{-1} \begin{bmatrix} c'_0 \\ c'_1 \\ \vdots \\ c'_{k-1} \end{bmatrix}. \tag{8}$$

Efficient Implementation of Reed-Solomon High-Rate ERC

A number of technologies that speed up the Reed-Solomon high rate erasure encoding/decoding operations now will be examined. The first technology is the calculation of the direct inverse of the sub-generator matrix Gk using the structure of the Reed-Solomon generator matrix. The second technology is a scalar vector multiplication and addition technique that speeds up the scalar vector multiplication and addition operations, which are the dominant operations in the erasure encoding/decoding operation.

Direct Inverse of the Sub-Generator Matrix for the Vandermonde Matrix

Assume that the k coded messages received $\{c'_0, c'_1, \ldots, c'_{k-1}\}$ are indexed as $\{t_0, t_1, \ldots, t_{k-1}\}$. The sub-generator matrix $G_k$ are:

$$G_k = \begin{bmatrix} t_0^0 & t_0^1 & \cdots & t_0^k \\ t_1^0 & t_1^1 & \cdots & t_1^k \\ \vdots & \vdots & \ddots & \vdots \\ t_{k-1}^0 & t_{k-1}^1 & \cdots & t_{k-1}^k \end{bmatrix}. \tag{9}$$

The inverse of the Vandermonde matrix can be calculated via:

$$G_k^{-1} = QD^{-1}, \tag{10}$$

where $$Q = \begin{bmatrix} q_{k-1}(t_0) & q_{k-1}(t_1) & \cdots & q_{k-1}(t_{k-1}) \\ q_{k-2}(t_0) & q_{k-2}(t_1) & \cdots & q_{k-2}(t_{k-1}) \\ \vdots & \vdots & & \vdots \\ q_0(t_0) & q_0(t_1) & \cdots & q_0(t_{k-1}) \end{bmatrix} \tag{11}$$

$$D^{-1} = \begin{bmatrix} \frac{1}{d_0} & & & \\ & \frac{1}{d_1} & & \\ & & \ddots & \\ & & & \frac{1}{d_{k-1}} \end{bmatrix}, \tag{12}$$

with $$d_i = \prod_{j \neq i}(t_j - t_i), \tag{13}$$

and $$q_j(x) = \begin{cases} q_{j-1}(x)x + a_j, & j > 0 \\ 1, & j = 0 \end{cases}, \tag{14}$$

and $a_j$ is the coefficient of the polynomial:

$$f(x) = \prod_{i=0}^{k-1}(x - t_i) = \sum_{j=0}^{k} a_j x^j. \tag{15}$$

The direct inverse computation includes $k^2/2$ operations to calculate the coefficients $a_j$ (equation (15)), $k^2$ operations to calculate the coefficients $d_i$ (equation (13)), $k^2$ operations to calculate the elements of the matrix Q (equation (14)), and $k^2$ operations to calculate the elements of the matrix $QD^{-1}$ (equation (10)). The computation complexity of the direct inverse is thus $4.5k^2$, compared with $k^3$ if the inverse is calculated via Gaussian elimination. It should be noted that for $GF(2^q)$, the addition is a bitwise xor operation, and the multiplication requires two table lookups and one addition (via scalar vector multiplication and addition operation). Because the Galois Field multiplication is a dominating factor in computation complexity, the number of multiplications is mainly counted in the computation of the complexity.

Direct Inverse of the Sub-Generator Matrix for the Cauchy Matrix

The Cauchy matrix based Reed-Solomon codes consist of systematic and parity codes. Among the k received coded messages, assume k−s messages belong to the systematic codes, and are thus original. For convenience, all the original messages are moved to the front. Let the row index of the received original messages be $\{r_s, r_{s+1}, \ldots, r_{k-1}\}$, and the row index of the received parity messages be $\{t_0, t_1, \ldots, t_{s-1}\}$. Let the row index of the remaining non-received original messages be $\{r_0, r_1, \ldots, r_{s-1}\}$. The received coded messages form the sub-generator matrix $G_k$:

$$G_k = \begin{bmatrix} I_{k-s} & 0 \\ A & B \end{bmatrix}, \tag{16}$$

where A is a sx(k−s) Cauchy matrix of the form:

$$A = \begin{bmatrix} \frac{1}{t_0+r_s} & \frac{1}{t_0+r_{s+1}} & \cdots & \frac{1}{t_0 r_{k-1}} \\ \frac{1}{t_1+r_s} & \frac{1}{t_1+r_{s+1}} & \cdots & \frac{1}{t_1+r_{k-1}} \\ \vdots & \vdots & & \vdots \\ \frac{1}{t_{s-1}+r_s} & \frac{1}{t_{s-1}+r_{s+1}} & \cdots & \frac{1}{t_{s-1}+r_{k-1}} \end{bmatrix}, \quad (17)$$

and B is a s×s Cauchy matrix of the form:

$$B = \begin{bmatrix} \frac{1}{t_0+r_0} & \frac{1}{t_0+r_1} & \cdots & \frac{1}{t_0+r_{s-1}} \\ \frac{1}{t_1+r_0} & \frac{1}{t_1+r_1} & \cdots & \frac{1}{t_1+r_{s-1}} \\ \vdots & \vdots & & \vdots \\ \frac{1}{t_{s-1}+r_0} & \frac{1}{t_{s-1}+r_1} & \cdots & \frac{1}{t_{s-1}+r_{s-1}} \end{bmatrix}. \quad (18)$$

The inverse of the sub-generator matrix $G_k$ can be calculated as:

$$G_k^{-1} = \begin{bmatrix} I_{k-s} & 0 \\ 0 & B^{-1} \end{bmatrix} \begin{bmatrix} I_{k-s} & 0 \\ -A & I_s \end{bmatrix}. \quad (19)$$

The Cauchy matrix has the property that the determinant of an arbitrary Cauchy matrix B can be calculated as:

$$\det(B) = \frac{\prod_{i<j}(t_i-t_j)\prod_{i<j}(r_i-r_j)}{\prod_{i,j=0}^{s-1}(t_i+r_j)}, \quad (20)$$

Using the cofactor, the inverse of the Cauchy matrix can be directly calculated as:

$$B^{-1} = [d_{i,j}]_{i,j=0,\cdots,s-1}, \quad (21)$$

where:

$$d_{i,j} = (-1)^{i+j} \frac{e_j f_i}{a_j b_i (t_j+r_i)}, \quad (22)$$

$$a_m = \left\{\prod_{i<m}(t_i-t_m)\right\}\left\{\prod_{i>m}(t_m-t_i)\right\}, \quad (23)$$

$$b_m = \left\{\prod_{i<m}(r_i-r_m)\right\}\left\{\prod_{i>m}(r_m-r_i)\right\}, \quad (24)$$

$$e_m = \prod_i (t_m+r_i), \quad (25)$$

$$f_m = \prod_i (t_i+r_m). \quad (26)$$

The direct inverse computation includes $4s^2$ operations to calculate the coefficients $a_m$, $b_m$, $e_m$, $f_m$, $s^2$ operations to calculate the coefficients $d_{i,j}$, the computation complexity of the directly inverse is thus $5s^2$, compared with $s^3$ if the inverse is implemented via Gaussian elimination. Because $G_k^{-1}$ is to be multiplied with the received messages, which involve a scalar vector multiplication and addition operation, only log($a_k$), log($b_k$), log($e_k$), log($f_k$) and log($d_{i,j}$) need to be computed.

Galois Field Scalar Vector Multiplication and Addition

High-rate erasure resilient coding usually involves relatively long original and coded messages. It is not uncommon for the original and coded messages in the high rate erasure coding applications to be approximately 1 kilobyte(KB) or larger. During the encoding/decoding operations, the message can be considered as a long vector of GF(p) elements. Therefore, one of the key operations in the erasure encoding/decoding is the following scalar vector multiplication and addition operation:

$$y = y + \alpha \cdot x, \quad (27)$$

where x and y are vectors of /GF(p) symbols, and α (alpha) is a scalar number in GF(p). The update vector is y and the content vector is x. In erasure encoding, each erasure coded message generated via equation (2) requires k scalar vector multiplication and addition operations. The erasure decoding operation of equation (8) can be accomplished by first calculating the elements of the inverse of the sub-generator matrix $G_k^{-1}$, and then calculating the decoded messages via $k^2$ scalar vector multiplication and addition operations. In Cauchy matrix based Reed-Solomon decoding, the elements of the matrix $B^{-1}$ and A in equation (19) are first calculated. Next, k·s scalar vector multiplication and addition operations are used to calculate the decoded messages.

The scalar vector multiplication and addition operation can be efficiently calculated in GF(p) as follows. First, preparatory to the operation, establish or pre-calculate a logarithmic lookup table on GF(p) for the logarithmic operation:

$$\log(x) = \log x, \quad (28)$$

and an exponential lookup table on GF(p) for the exponential operation:

$$\exp(x) = e^x. \quad (29)$$

On GF(p), each lookup tables contains p elements and only needs to be pre-calculated once. It should be noted that the lookup table only needs to be calculated once on GF(p), then it may be stored in a static data array or ROM for later usage.

The first step is to test whether α (alpha is equal to zero). If α does equal 0, then the result of the computation in equation (27) is simply y. This step is optional and not always necessary, as certain coefficients of the generator matrix and its inverse are guaranteed to be non-zero, and need no testing.

The next step is to calculate the logarithm of α. This can be done using the logarithmic lookup table. Next, multiplication and addition is performed for each element or symbol $x_i$ and $y_i$ of the messages x and y. Initially, a test is performed to see whether the symbol $x_i$ equals zero. For non-zero symbol $x_i$, the following operation is performed to update $y_i$:

$$y_i = y_i + \exp(\log(\alpha) + \log(x_i)). \quad (30)$$

For zero symbol $x_i$, the corresponding $y_i$ is not changed. The operation of equation (30) can be accomplished via a logarithmic table lookup, an addition, an exponential table lookup, and an addition on the Galois Field. Note on GF($2^p$), the final operation is a bitwise xor operation.

V. Working Example and Experimental Results

In order to more fully understand the new high-rate Reed-Solomon ERC system and method disclosed herein, the operational details of an exemplary working example are presented. It should be noted that this working example is only one way in which the new high-rate Reed-Solomon ERC system and method may be implemented.

In this working example, the new high-rate Reed-Solomon ERC system and method implements the new high-rate Reed-Solomon erasure resilient codes based on the Vandermonde and the Cauchy matrix on $GF(2^{16})$. The order of the Galois Field was selected to be $2^{16}$ because of the following. The order p of a general Galois Field must satisfy:

$$p=z^q, \quad (31)$$

where z is a prime, and q is a positive integer. Nevertheless, $GF(z^q)$ with z other than 2 does not correspond well with information representation in the computer and requires additional bit to represent the coded message, and thus should not be used. In $GF(2^q)$, each Galois Field symbol can be represented as a q-bit binary. The symbol in $GF(2^q)$ with q=8, 16 and 32 can be especially efficiently processed, as it corresponds to a byte (8 bit), a word (16 bit), and a double word (32 bit) in the computer.

$GF(2^8)$ can only accommodate a maximum of $2^8=256$ coded messages, which is a little bit small for many high rate erasure coding applications. In $GF(2^{32})$, the logarithmic and exponential lookup table contains $2^{32}$ entries, and thus cannot be used. Instead, the multiplication operation on $GF(2^{32})$ has to be factored into 6 multiplication operations on the subfield $GF(2^{16})$, which increases the computation complexity. Thus, in this working example, the high rate Reed-Solomon erasure resilient code on $GF(2^{16})$ was implemented. The maximum coded message space is $2^{16}=65536$. This leads to a maximum expansion ratio of 4096 if the number of original messages is 16, and a maximum expansion ratio of 256 if the number of original messages is 256. Both of which are large enough for most applications. The logarithmic and exponential lookup tables on $GF(2^{16})$ contain 65536 entries, and are 128 KB each.

The working example implementation was tested by running erasure encoding and decoding operations, and observing the amount of data that can be processed each second. The parameter of the erasure resilient code used in this working example is as follows. The length of the message was 1 KB, and the number of the original messages was 16. In this working example, the new high-rate Reed-Solomon ERC system and method achieved an encoding/decoding throughput of 25 MB per second, (i.e., 200 Mbps) on a Pentium 2.8 Ghz computer. Alternatively speaking, if the computer network operates at 10 Mbps, the erasure encoding/decoding operation only takes 5% of the CPU load. There was no significant performance difference observed between the Reed-Solomon codes based on the Vandermonde matrix and the Cauchy matrix.

In a paper by J. Bloemer, M. Kalfane, M. Karpinski, R. Karp, Luby and D. Zuckerman, entitled "An xor-based erasure-resilient scheme", in ICSI TR-95-048, August 1995, Berkeley, Calif., they implement a Reed-Solomon erasure encoding/decoding operation via xor operation. Their implementation requires on average q xor operations for each multiplication operation on $GF(2^q)$. In comparison, using the scalar vector multiplication and addition operation set forth in equation (27), the corresponding operation of the implementation disclosed herein takes one comparison to zero, two table lookups, one addition and one xor operation. In this working example, the Bloemer et al. algorithm was tested and found that it achieves a throughput of 16 MB per second. Thus, in this working example, the new high-rate Reed-Solomon ERC system and method disclosed herein was 50% faster than the Bloemer et al. implementation.

VI. Exemplary Operating Environment

The new high-rate Reed-Solomon ERC system and method are designed to operate in a computing environment and on a computing device. The computing environment in which the new high-rate Reed-Solomon ERC system and method operates will now be discussed. The following discussion is intended to provide a brief, general description of a suitable computing environment in which the new high-rate Reed-Solomon ERC system and method may be implemented.

Figure 6:
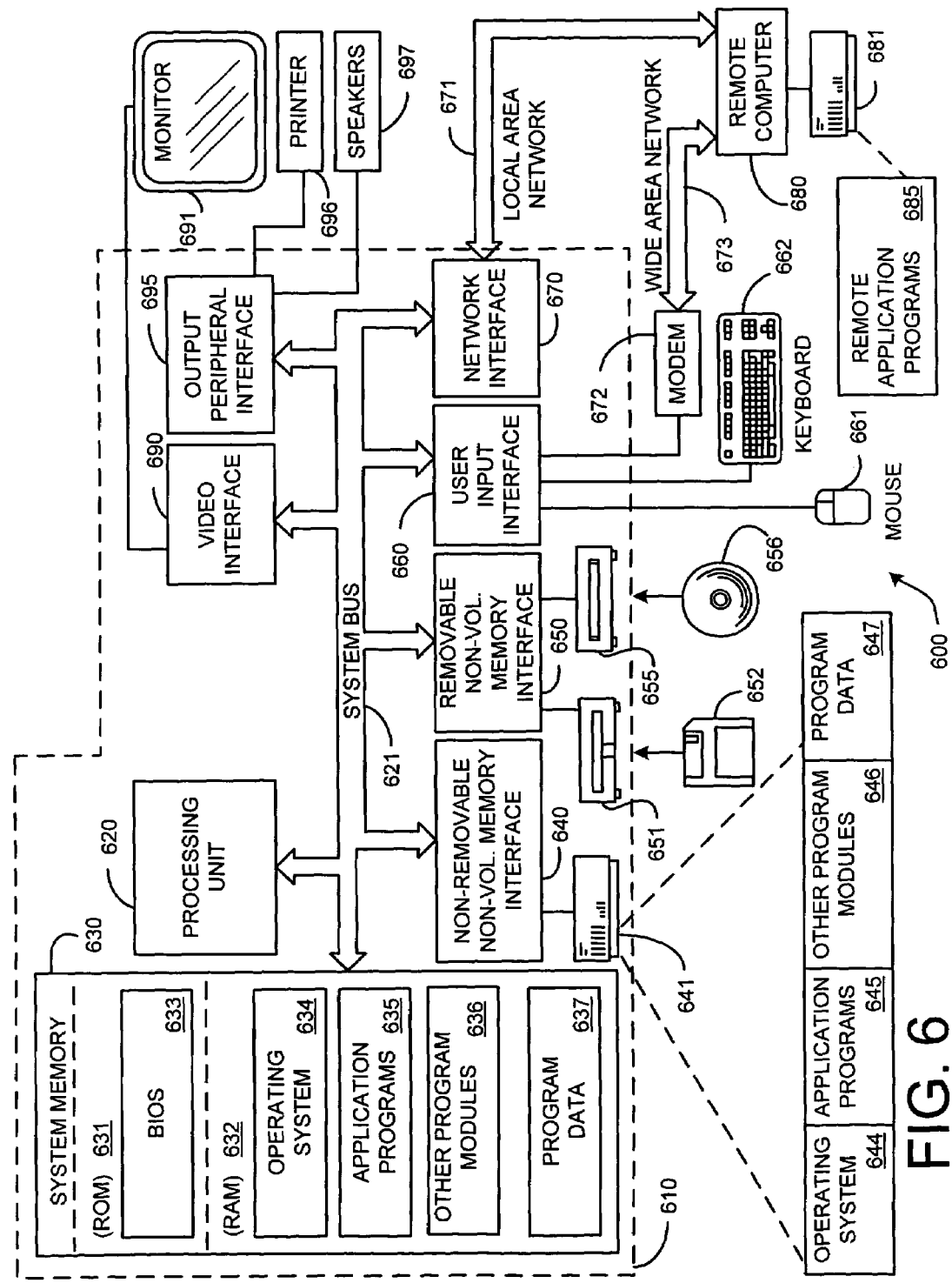
FIG. 6 illustrates an example of a suitable computing system environment in which the new high-rate Reed-Solomon ERC system and method shown in FIGS. 1, 2 and 3 may be implemented.

FIG. 6 illustrates an example of a suitable computing system environment in which the new high-rate Reed-Solomon ERC system and method shown in FIGS. 1, 2 and 3 may be implemented. The computing system environment 600 is only one example of a suitable computing environment and is not intended to suggest any limitation as to the scope of use or functionality of the invention. Neither should the computing environment 600 be interpreted as having any dependency or requirement relating to any one or combination of components illustrated in the exemplary operating environment 600.

The new high-rate Reed-Solomon ERC system and method is operational with numerous other general purpose or special purpose computing system environments or configurations. Examples of well known computing systems, environments, and/or configurations that may be suitable for use with the new high-rate Reed-Solomon ERC system and method include, but are not limited to, personal computers, server computers, hand-held, laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

The new high-rate Reed-Solomon ERC system and method may be described in the general context of computer-executable instructions, such as program modules, being executed by a computer. Generally, program modules include routines, programs, objects, components, data structures, etc., that perform particular tasks or implement particular abstract data types. The new high-rate Reed-Solomon ERC system and method may also be practiced in distributed computing environments where tasks are performed by remote processing devices that are linked through a communications network. In a distributed computing environment, program modules may be located in both local and remote computer storage media including memory storage devices. With reference to FIG. 6, an exemplary system for implementing the new high-rate Reed-Solomon ERC system and method includes a general-purpose computing device in the form of a computer 610. The peer nodes shown in FIGS. 1 and 2 are examples of the computer 610.

Components of the computer 610 may include, but are not limited to, a processing unit 620, a system memory 630, and a system bus 621 that couples various system components including the system memory to the processing unit 620. The system bus 621 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 610 typically includes a variety of computer readable media. Computer readable media can be any available media that can be accessed by the computer 610 and includes both volatile and nonvolatile media, removable and non-removable media. By way of example, and not limitation, computer readable media may comprise computer storage media and communication media. Computer storage media includes volatile and nonvolatile removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computer 610. Communication media typically embodies computer readable instructions, data structures, program modules or other data in a modulated data signal such as a carrier wave or other transport mechanism and includes any information delivery media.

Note that the term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 630 includes computer storage media in the form of volatile and/or nonvolatile memory such as read only memory (ROM) 631 and random access memory (RAM) 632. A basic input/output system 633 (BIOS), containing the basic routines that help to transfer information between elements within the computer 610, such as during start-up, is typically stored in ROM 631. RAM 632 typically contains data and/or program modules that are immediately accessible to and/or presently being operated on by processing unit 620. By way of example, and not limitation, FIG. 6 illustrates operating system 634, application programs 635, other program modules 636, and program data 637.

The computer 610 may also include other removable/non-removable, volatile/nonvolatile computer storage media. By way of example only, FIG. 6 illustrates a hard disk drive 641 that reads from or writes to non-removable, nonvolatile magnetic media, a magnetic disk drive 651 that reads from or writes to a removable, nonvolatile magnetic disk 652, and an optical disk drive 655 that reads from or writes to a removable, nonvolatile optical disk 656 such as a CD ROM or other optical media.

Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 641 is typically connected to the system bus 621 through a non-removable memory interface such as interface 640, and magnetic disk drive 651 and optical disk drive 655 are typically connected to the system bus 621 by a removable memory interface, such as interface 650.

The drives and their associated computer storage media discussed above and illustrated in FIG. 6, provide storage of computer readable instructions, data structures, program modules and other data for the computer 610. In FIG. 6, for example, hard disk drive 641 is illustrated as storing operating system 644, application programs 645, other program modules 646, and program data 647. Note that these components can either be the same as or different from operating system 634, application programs 635, other program modules 636, and program data 637. Operating system 644, application programs 645, other program modules 646, and program data 647 are given different numbers here to illustrate that, at a minimum, they are different copies. A user may enter commands and information into the computer 610 through input devices such as a keyboard 662 and pointing device 661, commonly referred to as a mouse, trackball or touch pad.

Other input devices (not shown) may include a microphone, joystick, game pad, satellite dish, scanner, radio receiver, or a television or broadcast video receiver, or the like. These and other input devices are often connected to the processing unit 620 through a user input interface 660 that is coupled to the system bus 621, but may be connected by other interface and bus structures, such as, for example, a parallel port, game port or a universal serial bus (USB). A monitor 691 or other type of display device is also connected to the system bus 621 via an interface, such as a video interface 690. In addition to the monitor, computers may also include other peripheral output devices such as speakers 697 and printer 696, which may be connected through an output peripheral interface 695.

The computer 610 may operate in a networked environment using logical connections to one or more remote computers, such as a remote computer 680. The remote computer 680 may be a personal computer, a server, a router, a network PC, a peer device or other common network node, and typically includes many or all of the elements described above relative to the computer 610, although only a memory storage device 681 has been illustrated in FIG. 6. The logical connections depicted in FIG. 6 include a local area network (LAN) 671 and a wide area network (WAN) 673, but may also include other networks. Such networking environments are commonplace in offices, enterprise-wide computer networks, intranets and the Internet.

When used in a LAN networking environment, the computer 610 is connected to the LAN 671 through a network interface or adapter 670. When used in a WAN networking environment, the computer 610 typically includes a modem 672 or other means for establishing communications over the WAN 673, such as the Internet. The modem 672, which may be internal or external, may be connected to the system bus 621 via the user input interface 660, or other appropriate mechanism. In a networked environment, program modules depicted relative to the computer 610, or portions thereof, may be stored in the remote memory storage device. By way of example, and not limitation, FIG. 6 illustrates remote application programs 685 as residing on memory device 681. It will be appreciated that the network connections shown are exemplary and other means of establishing a communications link between the computers may be used.

The foregoing description of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description of the invention, but rather by the claims appended hereto.

What is claimed is:

1. A method for encoding and decoding original messages in a high-rate erasure resilience coding application having a coded message space that is at least an order of magnitude larger than a number of original messages, the method comprising:

performing high-rate Reed-Solomon erasure resilient code encoding and decoding operations on the original messages using a scalar vector multiplication and addition technique represented by the equation $y=y+\alpha x$, where x and y are vectors of symbols of a Galois Field, GF(p), and where y is an order of the Galois Field, and where alpha, $\alpha$, is a scalar number in GF(p), and where y is an update vector and x is a content vector; the scalar vector multiplication and addition technique further comprising:

establishing a logarithm lookup table and an exponential lookup table in advance of the encoding and decoding operations;

calculating a logarithm of alpha, $\alpha$, using the logarithm lookup table;

calculating a logarithm of an element of the content vector, $x_i$;

testing whether the element of the content vector, $x_i$, is equal to zero;

for zero $x_i$; performing nothing;

for non-zero $x_i$, calculating an exponential of a sum of $\log(\alpha)$ and a logarithm of the element of the content vector, $x_i$, using the exponential lookup table to generate an intermediate result;

generating an updated element of the update vector, $y_i$, by adding on the Galois Field the intermediate result to a current element of the update vector, $y_i$ to obtain scalar vector multiplication and addition results; and using the scalar vector multiplication and addition results to encode the original messages and decode encoded messages to recover the original messages.

2. The method of claim 1, wherein the Galois Field is $GF(2^q)$.

3. The method of claim 2, wherein the adding on the Galois Field is a bitwise xor operation.

4. The method of claim 1, further comprising testing whether the scalar number, $\alpha$, is equal to zero.

5. The method of claim 4, further comprising:
determining that the scalar number, $\alpha$, is equal to zero; and
taking no further action for the current element.

6. The method of claim 1, further comprising using a generator matrix that is a Vandermonde matrix.

7. The method of claim 1, further comprising using a generator matrix that is a Cauchy matrix.

8. A computer-implemented process for using high-rate Reed-Solomon erasure resilient codes in a Galois field to perform encoding and decoding of k number of original messages in a high-rate erasure resilience coding application, wherein high-rate means that a number of coded message space is at least an order of magnitude larger than a the k number of original messages, comprising:

using a generator matrix, G, to encode the original messages and decode encoded messages to recover the original messages, the generator matrix, G, being a modified Vandermonde matrix given by:

$$G = \begin{bmatrix} 0^0 & 0^1 & \cdots & 0^k \\ 1^0 & 1^1 & \cdots & 1^k \\ \vdots & \vdots & \ddots & \vdots \\ (n-1)^0 & (n-1)^1 & \cdots & (n-1)^k \end{bmatrix};$$

generating an encoded message, $c_i$, which is indexed as i, using the equation:

$$c_i = \begin{bmatrix} i^0 & i^1 & \cdots & i^{k-1} \end{bmatrix} \begin{bmatrix} x_0 \\ x_1 \\ \vdots \\ x_{k-1} \end{bmatrix}; \text{ and}$$

calculating the encoded message, $c_i$, wherein calculating further comprises:
setting an update element, y, to be zero; and
performing k scalar vector multiplication and addition on original messages $x_0, x_1, \ldots, x_{k-1}$, the scalar vector multiplication and addition represented by the equation $y=y+\alpha x$, where x and y are vectors of symbols of a Galois Field, GF(p), and where p is an order of the Galois Field, and where alpha, $\alpha$, is a scalar number in GF(p), and where y is an update vector and x is a content vector.

9. The computer-implemented process as set forth in claim 8, further comprising:
receiving k distinctive coded messages $\{c'_0, c'_1, \ldots, c'_{k-1}\}$, which are indexed as $\{t_0, t_1, \ldots, t_{k-1}\}$; and
decoding the original messages by calculating:

$$\begin{bmatrix} x_0 \\ x_1 \\ \vdots \\ x_{k-1} \end{bmatrix} = G_k^{-1} \begin{bmatrix} c'_0 \\ c'_1 \\ \vdots \\ c'_{k-1} \end{bmatrix},$$

where $$G_k = \begin{bmatrix} t_0^0 & t_0^1 & \cdots & t_0^k \\ t_1^0 & t_1^1 & \cdots & t_1^k \\ \vdots & \vdots & \ddots & \vdots \\ t_{k-1}^0 & t_{k-1}^1 & \cdots & t_{k-1}^k \end{bmatrix}.$$

10. The computer-implemented process as set forth in claim 9, wherein $G_k^{-1}$ is calculated using a direct inversion technique:

$$G_k^{-1} = QD^{-1},$$

where $$Q = \begin{bmatrix} q_{k-1}(t_0) & q_{k-1}(t_1) & \cdots & q_{k-1}(t_{k-1}) \\ q_{k-2}(t_0) & q_{k-2}(t_1) & \cdots & q_{k-2}(t_{k-1}) \\ \vdots & \vdots & & \vdots \\ q_0(t_0) & q_0(t_1) & \cdots & q_0(t_{k-1}) \end{bmatrix},$$

$$D^{-1} = \begin{bmatrix} \frac{1}{d_0} & & & \\ & \frac{1}{d_1} & & \\ & & \ddots & \\ & & & \frac{1}{d_{k-1}} \end{bmatrix},$$

with $$d_i = \prod_{j \neq i}(t_j - t_i),$$

-continued and $$q_j(x) = \begin{cases} q_{j-1}(x)x + a_j, & j > 0 \\ 1, & j = 0 \end{cases},$$

and $a_j$ is a coefficient of the polynomial:

$$f(x) = \prod_{i=0}^{k-1}(x - t_i) = \sum_{j=0}^{k} a_j x^j.$$

11. The computer-implemented process as set forth in claim 10, further comprising calculating each original message by applying k scalar vector multiplication and addition, with scalar parameter being the calculated coefficient in $G_k^{-1}$, vectors being the coded messages $c'_0, C'_1, \ldots, C'_{k-1}$.

12. A computer-implemented process for using high-rate Reed-Solomon erasure resilient codes in a Galois field to perform encoding and decoding of k number of original messages in a high-rate erasure resilience coding application, wherein high-rate means that a number of coded message space is at least an order of magnitude larger than a the k number of original messages, the process comprising:

using a generator matrix, G, which is in a Cauchy matrix form of:

$$G = \begin{bmatrix} I_k \\ \frac{1}{k+0} & \frac{1}{k+1} & \cdots & \frac{1}{k+(k-1)} \\ \frac{1}{(k+1)+0} & \frac{1}{(k+1)+1} & \cdots & \frac{1}{(k+1)+(k-1)} \\ \vdots & \vdots & \ddots & \vdots \\ \frac{1}{(n-1)+0} & \frac{1}{(n-1)+1} & \cdots & \frac{1}{(n-1)+(k-1)} \end{bmatrix};$$

wherein $I_k$ is an identity matrix:

generating an encoded message, $c_i$, with key i, wherein:

if $0 \leq i > k$, the encoded message is an original message $c_i = x_i$, if $i \geq k$, the encoded message is a parity message given by the equation:

$$c_i = \begin{bmatrix} \frac{1}{i+0} & \frac{1}{i+1} & \cdots & \frac{1}{i+(k-1)} \end{bmatrix} \begin{bmatrix} x_0 \\ x_1 \\ \vdots \\ x_{k-1} \end{bmatrix}; \text{ and}$$

calculating the encoded message, $c_i$, wherein calculating further comprises:

setting an update element, y, equal to zero; and
performing k scalar vector multiplication and addition on original messages $x_0, x_1, \ldots, x_{k-1}$, the scalar vector multiplication and addition represented by the equation $y = y + \alpha x$, where x and y are vectors of symbols of a Galois Field, GF(p), and where p is an order of the Galois Field, and where alpha, $\alpha$, is a scalar number in GF(p), and where y is an update vector and x is a content vector.

13. The computer-implemented process of claim 12, further comprising:

receiving k distinctive coded messages, wherein s messages are parity messages with keys $\{t_0, t_1, \ldots, t_{s-1}\}$ and k−s messages are original messages with keys $\{r_s, r_{s+1}, \ldots, r_{k-1}\}$, and keys of remaining non-received original messages are $\{r_0, r_1, \ldots, r_{s-1}\}$; and decoding the original messages from the coded messages by calculating:

$$\begin{bmatrix} x_0 \\ x_1 \\ \vdots \\ x_{k-1} \end{bmatrix} = G_k^{-1} \begin{bmatrix} c'_0 \\ c'_1 \\ \vdots \\ c'_{k-1} \end{bmatrix},$$

where $G_k = \begin{bmatrix} I_{k-s} & 0 \\ A & B \end{bmatrix}$, where A is a sx(k−s) Cauchy matrix of the form:

$$A = \begin{bmatrix} \frac{1}{t_0 + r_s} & \frac{1}{t_0 + r_{s+1}} & \cdots & \frac{1}{t_0 + r_{k-1}} \\ \frac{1}{t_1 + r_s} & \frac{1}{t_1 + r_{s+1}} & \cdots & \frac{1}{t_1 + r_{k-1}} \\ \vdots & \vdots & & \vdots \\ \frac{1}{t_{s-1} + r_s} & \frac{1}{t_{s-1} + r_{s+1}} & \cdots & \frac{1}{t_{s-1} + r_{k-1}} \end{bmatrix},$$

and B is a sxs Cauchy matrix of the form:

$$B = \begin{bmatrix} \frac{1}{t_0 + r_0} & \frac{1}{t_0 + r_1} & \cdots & \frac{1}{t_0 + r_{s-1}} \\ \frac{1}{t_1 + r_0} & \frac{1}{t_1 + r_1} & \cdots & \frac{1}{t_1 + r_{s-1}} \\ \vdots & \vdots & & \vdots \\ \frac{1}{t_{s-1} + r_0} & \frac{1}{t_{s-1} + r_1} & \cdots & \frac{1}{t_{s-1} + r_{s-1}} \end{bmatrix}.$$

14. The computer-implemented process of claim 13, further comprising calculating $G_k^{-1}$ using a direct inversion technique, wherein $G_k^{-1}$ is given by the equation:

$$G_k^{-1} = \begin{bmatrix} I_{k-s} & 0 \\ 0 & B^{-1} \end{bmatrix} \begin{bmatrix} I_{k-s} & 0 \\ -A & I_s \end{bmatrix},$$

the direct inversion technique further comprising:

calculating a determinant of an arbitrary Cauchy matrix, B, using the equation:

$$\det(B) = \frac{\prod_{i<j}(t_i - t_j) \prod_{i<j}(r_i - r_j)}{\prod_{i,j=0}^{s-1}(t_i + r_j)}, \text{ and}$$

using a cofactor to directly calculate an inverse of the Cauchy matrix as:

$$B^{-1} = [d_{i,j}]_{i,j=0,\ldots,s-1},$$

where:

$$d_{i,j} = (-1)^{i+j} \frac{e_j f_i}{a_j b_i (t_j + r_i)},$$

$$a_m = \left\{\prod_{i<m} (t_i - t_m)\right\}\left\{\prod_{i<m} (t_m - t_i)\right\},$$

$$b_m = \left\{\prod_{i<m} (r_i - r_m)\right\}\left\{\prod_{i>m} (r_m - r_i)\right\},$$

-continued $$e_m = \prod_i (t_m + r_i),$$

$$f_m = \prod_i (t_i + r_m).$$

15. The computer-implemented process of claim 14, further comprising calculating each non-received original messages (total s messages) by applying k scalar vector multiplication and addition, with the scalar parameter being a coefficient in matrix −A and $B^{-1}$, and vectors being the coded messages $c'_0, c'_1, \ldots, c'_{k-1}$.

\* \* \* \* \*